United States Patent
Mayr

(10) Patent No.: US 11,350,520 B2
(45) Date of Patent: May 31, 2022

(54) COMPONENT CARRIER AND METHOD OF MANUFACTURING THE SAME

(71) Applicant: AT&S Austria Technologie & Systemtechnik Aktiengesellschaft, Leoben (AT)

(72) Inventor: Günther Mayr, Milpitas, CA (US)

(73) Assignee: AT&S Austria Technologie & Systemtechnik Aktiengesellschaft, Leoben (AT)

(*) Notice: Subject to any disclaimer, the term of this patent is extended or adjusted under 35 U.S.C. 154(b) by 166 days.

(21) Appl. No.: 16/535,474

(22) Filed: Aug. 8, 2019

(65) Prior Publication Data
US 2021/0045233 A1 Feb. 11, 2021

(51) Int. Cl.
| | |
|---|---|
| *H05K 1/02* | (2006.01) |
| *H05K 1/09* | (2006.01) |
| *H05K 1/03* | (2006.01) |
| *H05K 1/11* | (2006.01) |
| *H05K 3/42* | (2006.01) |
| *H05K 3/40* | (2006.01) |
| *H05K 3/46* | (2006.01) |

(52) U.S. Cl.
CPC ......... *H05K 1/0222* (2013.01); *H05K 1/0366* (2013.01); *H05K 1/09* (2013.01); *H05K 1/115* (2013.01); *H05K 3/4069* (2013.01); *H05K 3/4076* (2013.01); *H05K 3/429* (2013.01); *H05K 3/4644* (2013.01); *H05K 2201/09227* (2013.01); *H05K 2201/09609* (2013.01)

(58) Field of Classification Search
CPC .. H05K 3/40; H05K 3/42; H05K 3/46; H05K 3/429; H05K 3/4069; H05K 3/4644; H01P 3/06; H01P 3/08
USPC ................. 361/790, 792–795, 803, 816, 818
See application file for complete search history.

(56) References Cited

U.S. PATENT DOCUMENTS

| | | | | |
|---|---|---|---|---|
| 4,673,904 A | * | 6/1987 | Landis | H01L 23/5384 156/150 |
| 4,776,087 A | * | 10/1988 | Cronin | H01L 23/5384 257/E23.174 |
| 4,909,909 A | * | 3/1990 | Florjancic | H05K 3/465 205/125 |
| 6,239,385 B1 | * | 5/2001 | Schwiebert | H05K 3/3436 174/261 |

(Continued)

FOREIGN PATENT DOCUMENTS

| | | |
|---|---|---|
| JP | 2004063724 A | 2/2004 |
| JP | 2004063725 A | 2/2004 |

(Continued)

*Primary Examiner* — Tuan T Dinh
(74) *Attorney, Agent, or Firm* — Robert A. Blaha; Smith Tempel Blaha LLC

(57) ABSTRACT

A component carrier and a method of manufacturing the same are disclosed. The component carrier includes a stack having a plurality of electrically conductive layer structures and a plurality of electrically insulating layer structures and a coax structure with an electrically conductive substantially horizontally extending central trace and an electrically conductive surrounding structure at least partially surrounding the central trace with electrically insulating material in between. The coax structure is formed by material of the layer structures of the stack.

20 Claims, 7 Drawing Sheets

(56) References Cited

U.S. PATENT DOCUMENTS

| | | | | |
|---|---|---|---|---|
| 6,392,160 B1* | 5/2002 | Andry | ................. | H05K 1/0222 |
| | | | | 174/261 |
| 6,724,283 B2* | 4/2004 | Bergstedt | ................ | H01P 3/121 |
| | | | | 333/239 |
| 7,898,356 B2* | 3/2011 | Sherrer | ................ | H01P 11/005 |
| | | | | 333/34 |
| 2004/0108921 A1* | 6/2004 | Sacco | .................... | H01P 3/121 |
| | | | | 333/239 |
| 2005/0098348 A1* | 5/2005 | Okumichi | ............ | H01L 23/552 |
| | | | | 174/262 |
| 2010/0019859 A1* | 1/2010 | Lascari | .................. | H01P 1/047 |
| | | | | 333/33 |
| 2010/0065321 A1* | 3/2010 | Kashiwakura | ....... | H05K 1/0222 |
| | | | | 174/261 |
| 2011/0284282 A1* | 11/2011 | Ishida | ................. | H05K 3/4602 |
| | | | | 174/266 |
| 2013/0252445 A1* | 9/2013 | Barr | .................. | H01R 13/6586 |
| | | | | 439/90 |
| 2014/0015548 A1* | 1/2014 | Naughton | .......... | G01N 27/3278 |
| | | | | 324/658 |
| 2015/0003776 A1* | 1/2015 | Doyle | ................. | H05K 1/0274 |
| | | | | 385/14 |
| 2015/0181710 A1 | 6/2015 | Rathburn | | |
| 2015/0197062 A1 | 7/2015 | Shinar et al. | | |
| 2017/0223830 A1* | 8/2017 | Shirley | ................ | H01L 23/552 |

FOREIGN PATENT DOCUMENTS

| | | | |
|---|---|---|---|
| JP | 2006073589 A | 3/2006 | |
| KR | 20030082895 A | 10/2003 | |
| KR | 100573494 B1 | 5/2005 | |
| KR | 20070007406 A | 1/2007 | |

\* cited by examiner

COMPONENT CARRIER AND METHOD OF MANUFACTURING THE SAME

TECHNICAL FIELD

The invention relates to a component carrier and to a method of manufacturing the same.

TECHNOLOGICAL BACKGROUND

A conventional component carrier comprises a stack having a plurality of electrically conductive layer structures and a plurality of electrically insulating layer structures. Some of the electrically conductive layer structures are traces for carrying an electric data signal. In high speed data transmission applications and for ultra-critical signals, in particular in 5G or other RF applications, the signal integrity is an issue due to noise or disturbances. Usually, shieldings or shields made of prefabricated metal sheets are surface-mounted by a mounting or assembling machine in a separate manufacturing step to cover and shield the traces. However, such shields can be mounted only to specific areas of the component carrier. Furthermore, the size of the component carrier is increased by such shields.

SUMMARY

There is a need to provide a component carrier having improved signal integrity and a smaller size, and to provide a simplified method of manufacturing the component carrier. This object is achieved by the subject matter of the independent claims.

According to an exemplary embodiment of the invention, a component carrier is provided. The component carrier comprises a stack comprising a plurality of electrically conductive layer structures and a plurality of electrically insulating layer structures; a coax structure comprising an electrically conductive substantially horizontally extending central trace and an electrically conductive surrounding structure at least partially surrounding the central trace with electrically insulating material in between; wherein the coax structure is formed by material of the layer structures of the stack.

According to another exemplary embodiment of the invention, a method of manufacturing a component carrier is provided. The method comprises: forming a stack comprising a plurality of electrically conductive layer structures and a plurality of electrically insulating layer structures; forming a coax structure comprising an electrically conductive substantially horizontally extending central trace and an electrically conductive surrounding structure at least partially surrounding the central electrically conductive trace with electrically insulating material in between; wherein the method comprises forming the coax structure by material of the layer structures of the stack.

The component carrier according to the present invention comprises the coax structure with the substantially horizontally extending central trace. In other words, the trace is substantially not vertically orientated. The orientation of the trace can be determined on the basis of a current flow within the trace. However, this definition does not limit the scope. In the context of the present application, the term "substantially horizontally" may particularly denote an orientation which is in parallel to a main surface of the component carrier. The main surface of the component carrier can be that surface where electrical connections such as pads or terminals are provided. The main surface of the component carrier can also be that surface which is perpendicularly orientated to a direction in which layers of the component carrier are superposed onto each other.

In all embodiments, critical signals in the trace of the coax structure can be shielded at any side. For example, the component carrier according to the present invention can shield traces between or from antenna arrays of external sources and can ensure increased performance due to reduced impact of noise or disturbances, in particular for 5G or other RF applications with antenna arrays. The surrounding structure can furthermore have a benefit for a mechanical protection of the trace.

By forming the coax structure by the material of the layer structures of the stack, the electrically conductive surrounding structure can be manufactured substantially without any limitations in terms of position, thickness and shape. The manufacturing method can be simplified. Conventional shields made of prefabricated metal sheets are not necessary in the present invention so that the component carrier according to the present invention can be provided in a compact size.

OVERVIEW OF EMBODIMENTS

In the following, further exemplary embodiments of the present invention are explained.

In an embodiment, the trace and the surrounding structure are made of copper.

In an embodiment, the electrically insulating material comprises resin, in particular having reinforcing particles such as glass particles which can be glass fibers or glass spheres.

In an embodiment, the surrounding structure is formed of two substantially horizontally extending electrically conductive layer structures and of two substantially vertically extending electrically conductive layer structures.

In an embodiment, at least one of first and second ends of the trace is connected with a vertical through connection, in particular a copper filled laser via.

In an embodiment, the vertical through connection is surrounded by a respective shielding structure.

In an embodiment, the shielding structure is an array of further vertical through connections surrounding the electrically conductive through connection.

In an embodiment, the shielding structure is a closed or open ring filled with an electrically conductive material and surrounding the electrically conductive through connection.

In an embodiment, the surrounding structure has openings, where the electrically conductive through connection extends through the surrounding structure.

In an embodiment, the surrounding structure has a rectangular cross-section.

In an embodiment, horizontal portions and vertical portions of the surrounding structure are directly connected to each other.

In an embodiment, the surrounding structure is a sleeve or a cage surrounding the trace at all four sides thereof.

In other embodiments, the surrounding structure surrounds the trace at one, two, three or four sides thereof.

In an embodiment, the component carrier comprises at least one of the following features: the component carrier comprises at least one component being surface mounted on and/or embedded in the component carrier, wherein the at least one component is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip; wherein at least one of the electrically conductive layer structures of the component carrier comprises at least one of the group consisting of copper, aluminum, nickel, silver, gold, palladium, and tungsten, any of the mentioned materials being optionally coated with supra-conductive material such as graphene; wherein the electrically insulating layer structure comprises at least one of the group consisting of resin, in particular reinforced or non-reinforced resin, for instance epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide; wherein the component carrier is shaped as a plate; wherein the component carrier is configured as one of the group consisting of a printed circuit board, a substrate, and an interposer; wherein the component carrier is configured as a laminate-type component carrier.

In an embodiment, the method comprises manufacturing the trace on a block of an electrically insulating material formed on a first electrically conductive layer structure from the plurality electrically conductive layer structures.

In an embodiment, the method comprises manufacturing horizontal portions of the surrounding structure by the first electrically conductive layer structure below the block and a further electrically conductive layer structure above the trace and spaced thereof by a further electrically insulating layer structure.

In an embodiment, the method comprises manufacturing vertical portions of the surrounding structure by forming vertical trenches in the stack and subsequently filling the trenches with an electrically conductive material.

In an embodiment, the method comprises manufacturing horizontal portions of the surrounding structure and the trace by electrically conductive layer structures located at different levels, and manufacturing vertical portions of the surrounding structure by forming vertical trenches in the stack and subsequently filling the trenches with an electrically conductive material.

In an embodiment, the method comprises filling the trenches by deposition of an electrically conductive material by at least one of plating and sputtering.

In an embodiment, the method comprises filling the trenches by pressing an electrically conductive paste in the trenches.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (Teflon®), a ceramic, and a metal oxide. Teflon is a registered trademark of the Chemours Company FC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film or photo-imageable dielectric material for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
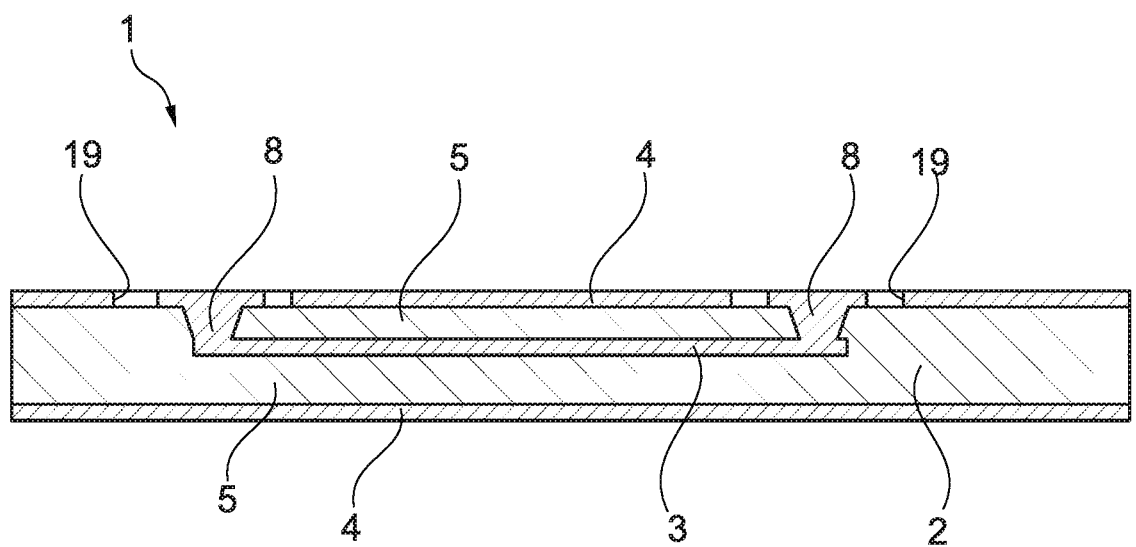
FIG. 1 illustrates a longitudinal sectional view of a component carrier according to an exemplary embodiment of the invention.

The illustrations in the drawings are schematically presented. In different drawings, similar or identical elements are provided with the same reference signs.

Figure 2:
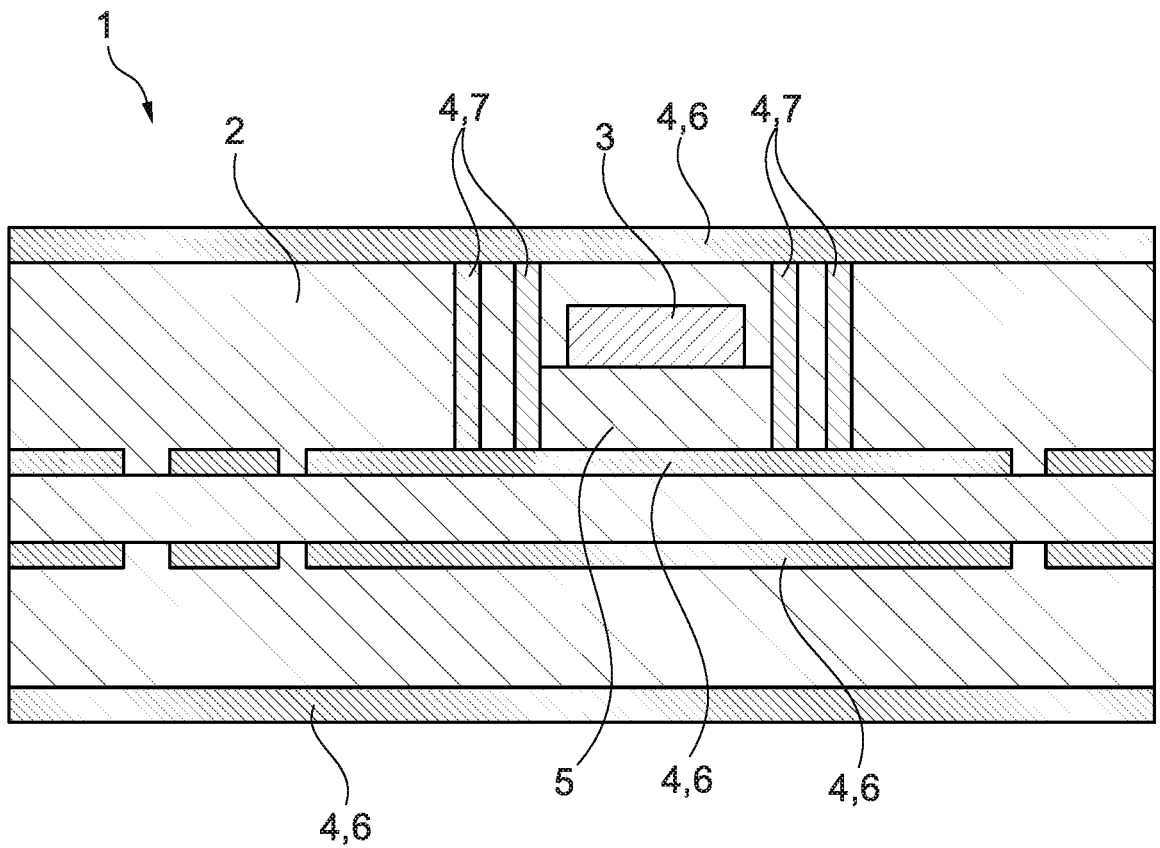
FIG. 2 illustrates a cross-sectional view of a component carrier according to an exemplary embodiment of the invention.

FIG. 1 illustrates a longitudinal sectional view of a component carrier 1 according to an exemplary embodiment of the invention, and FIG. 2 illustrates a cross-sectional view of the component carrier 1 according to the exemplary embodiment of the invention.

The component carrier 1 is shaped as a plate. The component carrier 1 can be configured as one of the group consisting of a printed circuit board, a substrate, and an interposer. The component carrier 1 can be configured as a laminate-type component carrier. The component carrier 1 can comprise at least one component (not shown) being surface mounted on and/or embedded in the component carrier, wherein the at least one component is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip.

The component carrier 1 comprises a core 2 having a plurality of electrically conductive layer structures and a plurality of electrically insulating layer structures.

At least one of the electrically conductive layer structures of the component carrier 1 can comprise at least one of the group consisting of copper, aluminum, nickel, silver, gold, palladium, and tungsten, any of the mentioned materials being optionally coated with supra-conductive material such as graphene.

At least one of the electrically insulating layer structures of the component carrier 1 can comprise at least one of the group consisting of resin, in particular reinforced or non-reinforced resin, for instance epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide.

The component carrier 1 comprises a coax structure comprising an electrically conductive substantially horizontally extending central trace 3 and an electrically conductive surrounding structure 4 at least partially surrounding the central trace 3 with electrically insulating material 5 in between. The coax structure is formed by materials of the layer structures of the stack.

The trace 3 and the surrounding structure 4 can be made of copper.

The electrically insulating material 5 can comprise a resin, in particular one having reinforcing particles such as glass fibers or glass spheres.

As shown in FIG. 2, the surrounding structure 4 has a rectangular layout in the cross-section. Substantially horizontally extending portions 6 and substantially vertically extending portions 7 of the surrounding structure 4 are directly connected to each other. The surrounding structure 4 is formed of at least two of the substantially horizontally extending electrically conductive layer structures 6 and of at least two of the substantially vertically extending electrically conductive layer structures 7.

More specific, the surrounding structure 4 in the embodiment of FIG. 2 includes two pairs of the substantially horizontally extending electrically conductive layer structures 6, wherein the two pairs of the substantially horizontally extending electrically conductive layer structures 6 are substantially symmetrically arranged to form an inner pair and an outer pair of substantially horizontally extending electrically conductive layer structures 6. The trace 3 is arranged inside the outer pair of substantially horizontally extending electrically conductive layer structures 6 but outside the inner pair of substantially horizontally extending electrically conductive layer structures 6.

In the embodiment of FIG. 2, the surrounding structure 4 further includes of two pairs of the substantially vertically extending electrically conductive layer structures 7, wherein the two pairs of the substantially vertically extending electrically conductive layer structures 7 are substantially symmetrically arranged to form an inner pair and an outer pair of substantially vertically extending electrically conductive layer structures 7. The trace 3 is arranged inside the inner and outer pairs of substantially vertically extending electrically conductive layer structures 7.

Back to FIG. 1, a first and a second end of the trace 3 are connected with respective vertical through connections 8, which are copper filled laser vias, in particular micro vias. The vertical through connections 8 can be terminated by a copper pad. The surrounding structure 4 forms openings 19, where the electrically conductive through connections 8 extend through the surrounding structure 4.

Figure 3:
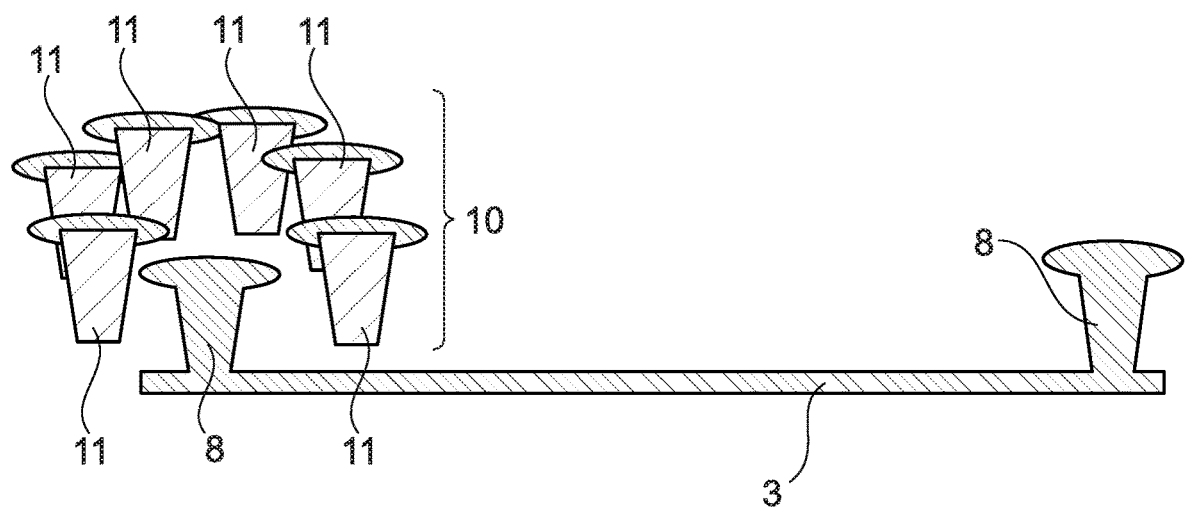
FIG. 3 illustrates a conceptual view of a coax structure of a component carrier according to an exemplary embodiment of the invention.

FIG. 3 illustrates a conceptual view of a coax structure of a component carrier according to an exemplary embodiment of the invention.

The vertical through connections 8 can be surrounded by a respective shielding structure 10. The shielding structure 10 is an array of further vertical through connections 11 surrounding the electrically conductive through connection 8.

Figure 4:
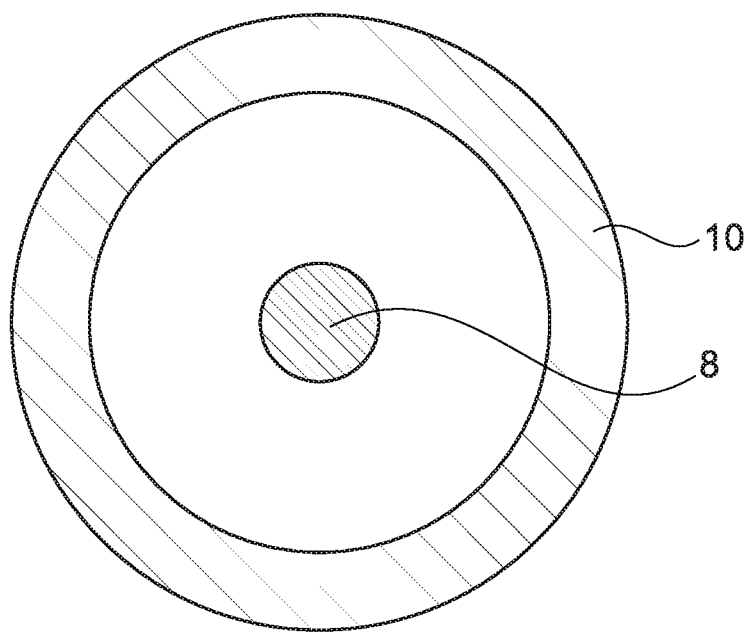
FIG. 4 illustrates cross-sectional views through vertical through connections of component carriers according to other exemplary embodiments of the invention.
Figure 4:
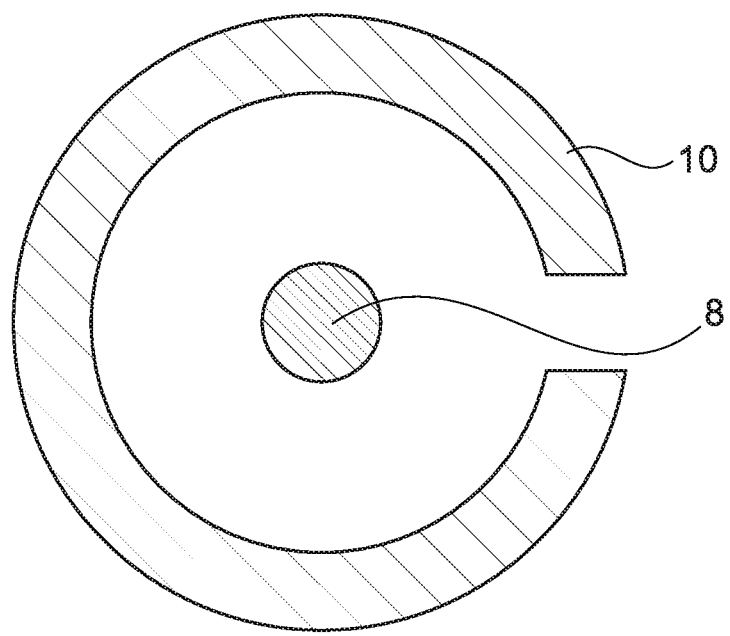

FIG. 4 illustrates a cross-sectional view through a vertical through connection 8 of a component carrier according to another exemplary embodiment of the invention.

The shielding structure 10 can either be a closed or open ring or annular recess which is filled with an electrically conductive material and surrounds the electrically conductive through connection 8.

Figure 5:
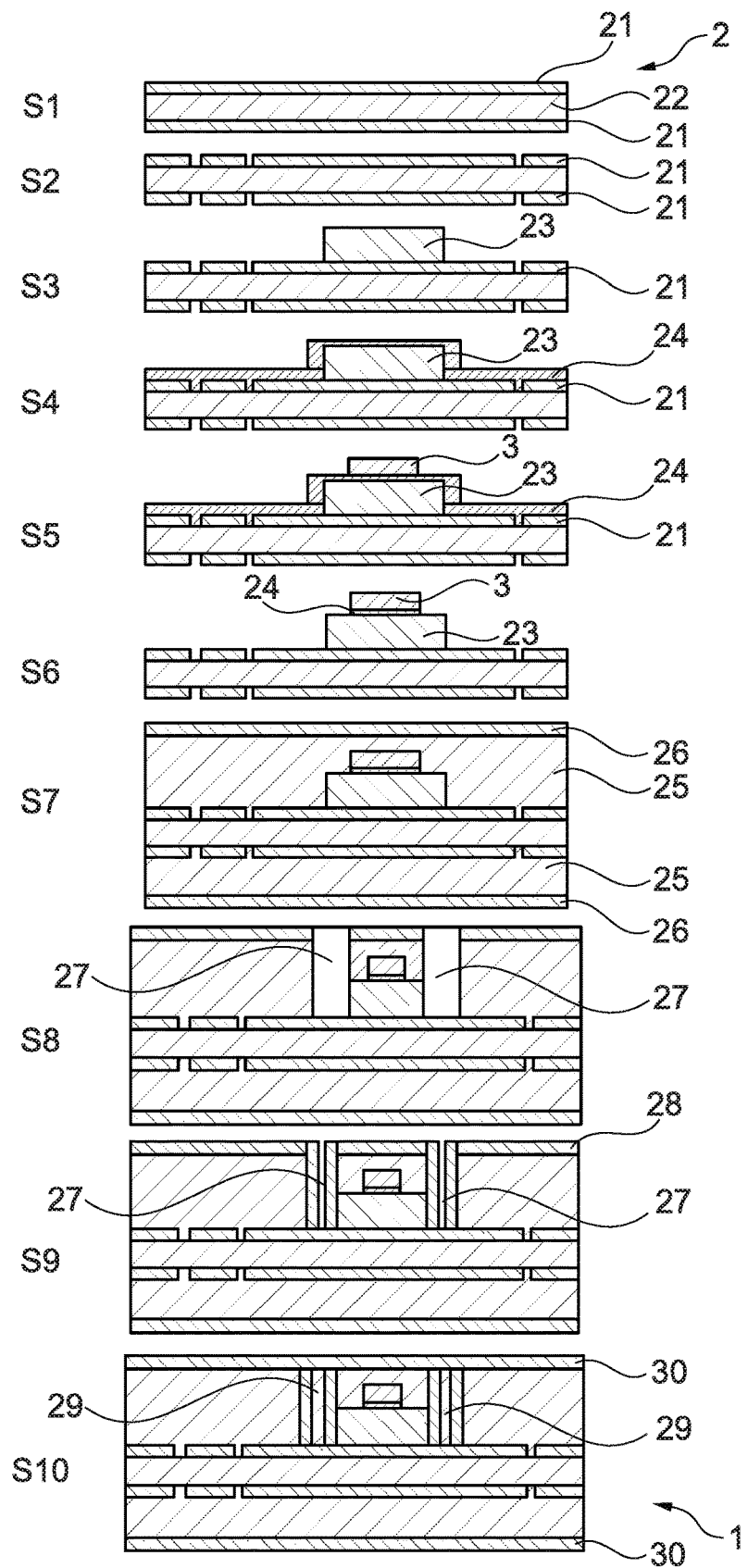
FIG. 5 illustrates a method of manufacturing a component carrier according to an exemplary embodiment of the invention.

FIG. 5 illustrates a method of manufacturing a component carrier 1 according to an exemplary embodiment of the invention.

In a step S1, a core 2 comprising an electrically conductive layer structure 21 at each main surface and an electrically insulating layer structure 22 there between is formed. Alternatively, a prefabricated core 2 can be utilized.

In a step S2, the electrically conductive layer structures 21 on both main surfaces are patterned, for example by a conventional subtractive patterning process such as a lithography process.

In a step S3, a block 23 is formed on a first electrically conductive layer structure 21 of the two patterned electrically conductive layer structures 21 of the core 2. The block 23 is made of an electrically insulating material. The block 23 can locally be printed on the one of the two patterned electrically conductive layer structures 21, such as by ink-jet printing. Alternatively, the block 23 can be formed by a photo-imageable dielectric (PID) material.

In a step S4, a copper layer 24 is chemically deposited globally on the one of the two patterned electrically conductive layer structures 21 and on the block 23. For example, the copper layer 24 can have a thickness of about 1 µm.

In a step S5, a trace 3 is locally plated on the copper layer 24 and above the block 23.

In a step S6, the global copper layer 24 is etched away at areas where the trace 3 is not arranged. The method steps S4 to S6, in which the trace 3 is formed, constitute a so called mSAP process (modified semi-additive process).

In a step S7, an electrically insulating layer structure 25, for example one layer or a plurality of layers of FR4, RCC, ABF or a combination thereof, and an electrically conductive layer 26, for example a copper layer, are build up on the stack manufactured so far. In the embodiment of FIG. 5, the electrically insulating layer structure 25 and the electrically conductive layer 26 are symmetrically formed on both sides of the stack manufactured so far. Alternatively, the electrically insulating layer structure 25 and the electrically conductive layer 26 can asymmetrically be formed on only that side of the stack manufactured so far, where the trace 3 is formed.

The electrically insulating layer structure 25 surrounds the trace 3 at the lateral sides and at the top thereof so that the trace 3 is embedded within the electrically insulating layer structure 25.

In a step S8, trenches 27 are formed in the electrically insulating layer structure 25 and the electrically conductive layer 26 at that side of the stack, where the trace 3 is formed. The trenches 27 can be formed by conventional lithography and etching processes to selectively remove the electrically conductive layer 26 at the desired locations of the trenches 27, and by a laser cutting process to remove the electrically insulating layer structure 25 at the desired locations of the trenches 27.

The trenches 27 are formed such that the trace 3 is still covered at its lateral sides by the electrically insulating layer structure 25.

In a step S9, the surface of the trenches 27 is plated with an electrically conductive layer 28, for example a copper layer. However, the trenches 27 are preferably not completely filled by the electrically conductive layer 28 so that the trenches 27 substantially remain and are just plated by the electrically conductive layer 28.

The electrically conductive layer 28 can be deposited by a plating or sputtering process. Alternatively, the electrically conductive layer 28 can be applied by pressing an electrically conductive paste in the trenches 27.

That is, the electrically conductive layer 28 forms the substantially vertically extending portions 7 of the surrounding structure 4 in FIG. 1.

In a step S10, the plated trenches 27 are plugged by an electrically insulating material 29. The electrically insulating material 29 forms a part of the electrically insulating material 5 of the component carrier 1 in FIGS. 1 and 2. Finally, the upper and lower surfaces of the stack are chemically plated with an electrically conductive layer 30, for example a copper layer 30. Alternatively, the electrically conductive layer 30 can asymmetrically be formed on only that side of the stack manufactured so far, where the trace 3 is formed.

That is, the electrically conductive layer 30 forms the substantially horizontally extending portions 6 of the surrounding structure 4 in FIG. 2.

After the step S10, further electrically insulating layer structures, for example one layer or a plurality of layers of FR4, RCC, ABF or a combination thereof, and further electrically conductive layers can be build-up, a solder resist and/or a surface finish can be provided.

The coax structure of the component carrier 1 manufactured by the method according to FIG. 5 comprises the electrically conductive substantially horizontally extending central trace 3 and the electrically conductive surrounding structures 21, 26, 28, 30 at least partially surrounding the central trace 3 with electrically insulating material 22, 23, 25, 29 in between. The electrically conductive surrounding structures 21, 26, 28, 30 altogether form the electrically conductive surrounding structure 4 as shown in FIGS. 1 and 2, and the electrically insulating material 22, 23, 25, 29 altogether form the electrically insulating material 5 as shown in FIGS. 1 and 2.

That is, the electrically conductive surrounding structure 4 of the coax structure is formed by the electrically conductive layer structures 21 of the core 2, the electrically conductive layer 26 manufactured in step S7, the electrically conductive layer 28 of the trenches 27, and the electrically conductive layers 30 at the upper and the lower surfaces of the stack manufactured so far.

That is, the surrounding structure 4 of the coax structure comprises horizontal portions 21 formed by the first electrically conductive layer structure 21 of the core 2 below the block 23 (and optionally further electrically conductive layer structures 26, 30 below the trace 3) and further electrically conductive layer structures 26, 30 above the trace 3 which are spaced thereof by the further electrically insulating layer structure 25. The surrounding structure is designated by reference sign 4 in the component carrier 1 of FIGS. 1 and 2.

The electrically insulating material 5 is formed by the block 23 below the trace 3, the electrically insulating layer structure 25 at the lateral sides and the top of the trace 3, the electrically insulating layer structure 22 of the core 2, and the electrically insulating material 29 inside the trenches 27. The electrically insulating material is designated by reference sign 5 in the component carrier 1 of FIGS. 1 and 2.

Figure 6:
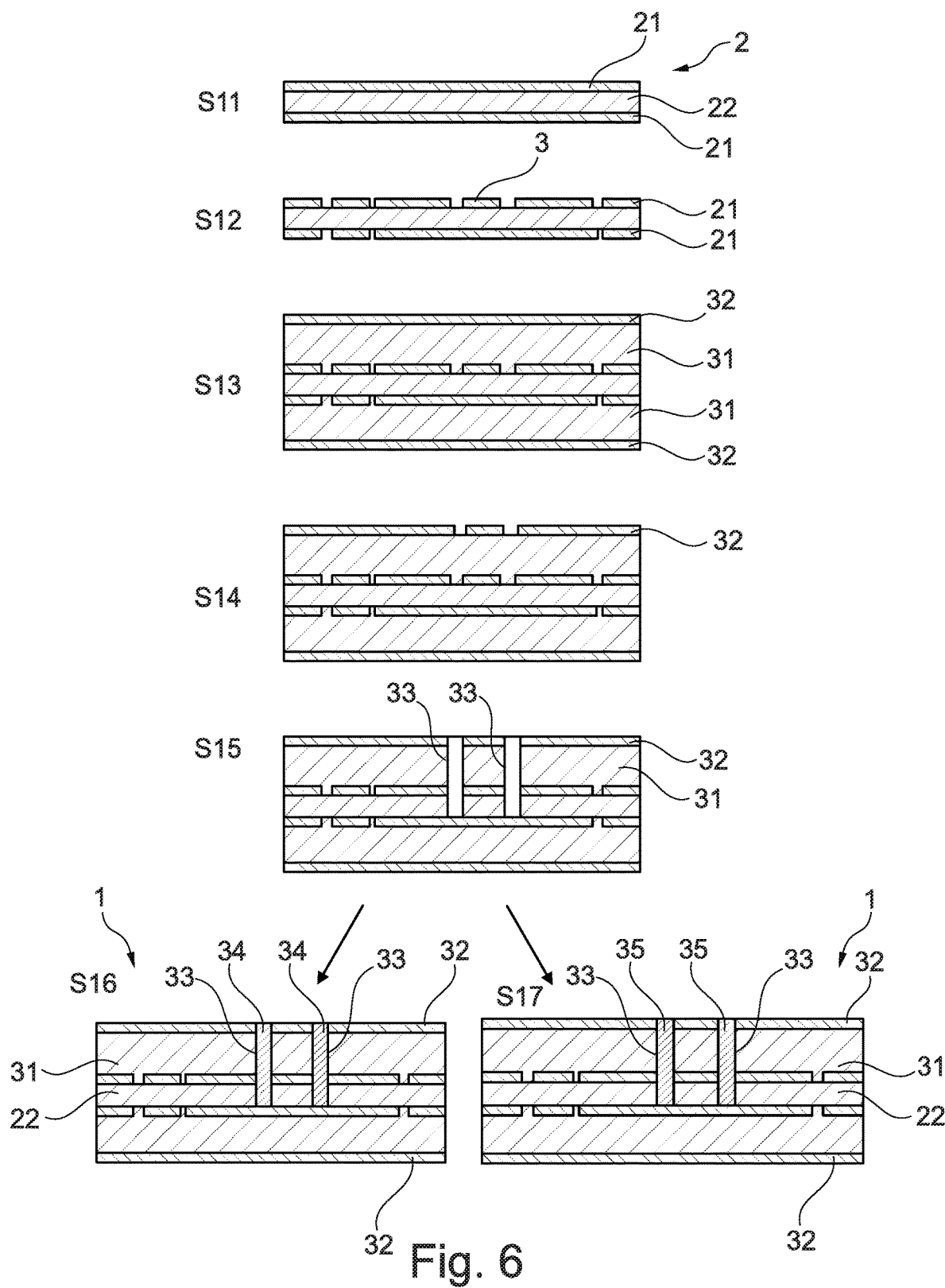
FIG. 6 illustrates a method of manufacturing a component carrier according to an exemplary embodiment of the invention.

FIG. 6 illustrates a method of manufacturing a component carrier 1 according to an exemplary embodiment of the invention.

In a step S11, a core 2 comprising an electrically conductive layer structure 21 at each main surface and an electrically insulating layer structure 22 there between is formed. Alternatively, a prefabricated core 2 can also be utilized.

In a step S12, the electrically conductive layer structures 21 are patterned, for example by a conventional subtractive patterning process such as a lithography process. In a middle portion of the upper electrically conductive layer structure 21 of the core 2, an electrically conductive substantially horizontally extending central trace 3 is formed which becomes a part of a coax structure.

In a step S13, an electrically insulating layer structure 31, for example one layer or a plurality of layers of FR4, RCC, ABF or a combination thereof, and an electrically conductive layer 32, for example a chemical copper layer, are build-up on the stack manufactured so far. In the embodiment of FIG. 5, the electrically insulating layer structure 31 and the electrically conductive layer 32 are symmetrically formed on both sides of the stack manufactured so far. Alternatively, the electrically insulating layer structure 31 and the electrically conductive layer 32 can asymmetrically be formed on only that side of the stack manufactured so far, where the trace 3 is formed.

In a step S14, parts of the electrically conductive layer 32 at the upper surface of the stack manufactured so far are selectively removed, for example by conventional lithography and etching processes. The removed parts are at desired locations of trenches 33 which are manufactured in a step S15.

In the step S15, the trenches 33 are formed in the upper electrically insulating layer structure 31 by a laser cutting process at the locations of the parts of the electrically conductive layer 32, which have previously been removed on step S14. The trenches 33 also pass the upper electrically conductive layer structure 21 of the core 2 at locations, which have selectively been removed in step S12 to form the trace 3. The trenches 33 end at the lower electrically conductive layer structure 21 of the core 2 because the lower electrically conductive layer structure 21 of the core 2 has not been removed at these locations in the step S12.

The trenches 33 are formed such that the trace 3 is still covered at its lateral sides by the electrically insulating layer structure 31.

After step S15, the process either proceeds to a step S16 or a step S17.

In the step S16, the surface of the trenches 33 is plated with an electrically conductive layer 34, for example with a copper layer. The trenches 33 can completely be filled by the electrically conductive layer 34. The electrically conductive layer 34 can be deposited by a plating or sputtering process.

In the step S17, an electrically conductive paste 35 is pressed in the trenches 33.

After the step S16 and the step S17, further electrically insulating layer structures, for example one layer or a plurality of layers of FR4, RCC, ABF or a combination thereof, and further electrically conductive layers can be build-up, a solder resist and/or a surface finish can be provided.

The coax structure of the component carrier 1 manufactured by the method according to FIG. 6 comprises the electrically conductive substantially horizontally extending central trace 3 and an electrically conductive surrounding structure at least partially surrounding the central trace 3 with electrically insulating material in between.

The trace 3 is formed by the selectively patterned upper electrically conductive layer structure 21 of the core 2.

The electrically conductive surrounding structure of the coax structure is formed by the lower electrically conductive layer structures 21 of the core 2, the electrically conductive layer 34 or 35 of the trenches 33, and the electrically conductive layers 32 at the upper and the lower surfaces of the stack manufactured so far, which are arranged below or underneath the trace 3.

That is, the surrounding structure of the coax structure comprises horizontal portions 21 formed by the electrically conductive layer structure 21 of the core 2 below the trace 3 and further electrically conductive layer structures 32 above and below the trace 3 which are spaced thereof by the further electrically insulating layer structure 31. The horizontal portions 21 of the surrounding structure surrounding the trace 3 and the trace 3 itself are manufactured by the electrically conductive layer structures 21 of the core 2 located at different levels.

In the embodiment of FIG. 6, vertical portions 34 or 35 of the surrounding structure surrounding the trace 3 are manufactured by forming the vertical trenches 33 in the stack, and by subsequently filling the trenches 33 with an electrically conductive material 34 or 35.

The surrounding structure is altogether designated by reference sign 4 in the component carrier 1 of FIGS. 1 and 2.

The electrically insulating material is formed by the electrically insulating layer structure 22 of the core 2 below the trace 3 and the electrically insulating layer structure 31 at the lateral sides and the top of the trace 3 as well as below the trace 3.

The electrically insulating material is altogether designated by reference sign 5 in the component carrier 1 of FIGS. 1 and 2.

FIGS. 7 to 10 illustrate a cross-sectional view of component carriers according to exemplary embodiments of the invention.

Figure 7:
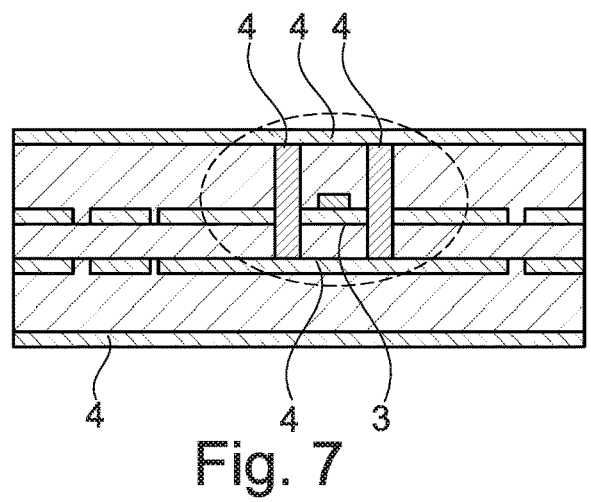
FIG. 7 illustrates a cross-sectional view of a component carrier according to an exemplary embodiment of the invention.

In the embodiment of FIG. 7, the surrounding structure 4 is a sleeve surrounding the trace 3 at all four sides thereof.

Figure 8:
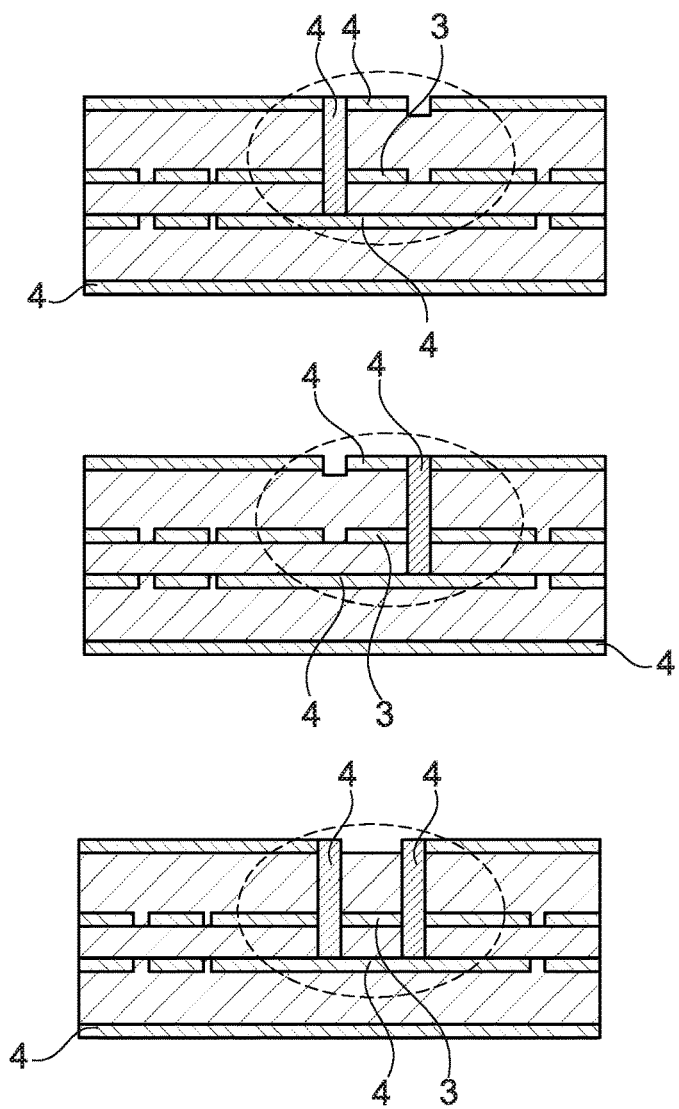
FIG. 8 illustrates cross-sectional views of component carriers according to exemplary embodiments of the invention.

In the embodiments of FIG. 8, the surrounding structure 4 surrounds the trace 3 at three sides thereof, respectively.

Figure 9:
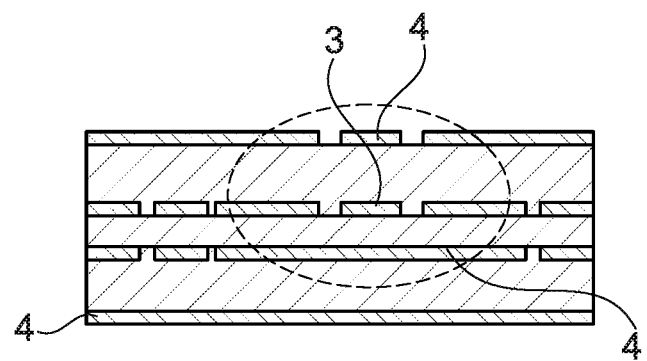
FIG. 9 illustrates cross-sectional views of component carriers according to exemplary embodiments of the invention.
Figure 9:
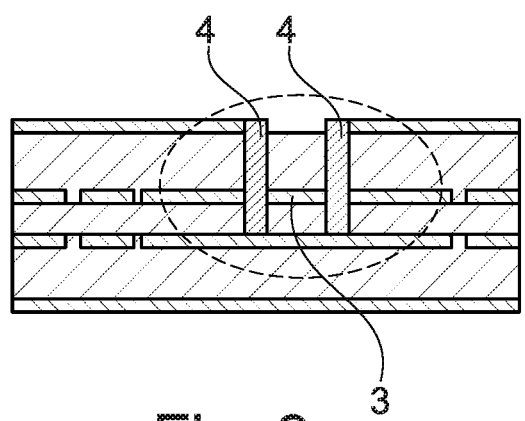

In the embodiments of FIG. 9, the surrounding structure 4 surrounds the trace 3 at two sides thereof, respectively.

Figure 10:
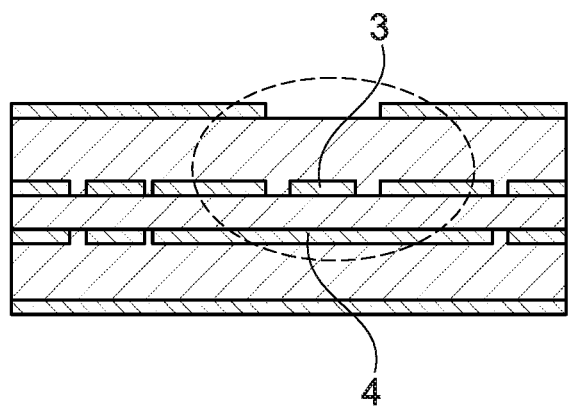
FIG. 10 illustrates a cross-sectional view of a component carrier according to an exemplary embodiment of the invention.

In the embodiment of FIG. 10, the surrounding structure 4 surrounds the trace 3 at one side thereof.

The surrounding structure 4 can be arranged at any side of the trace 3.

It should be noted that the term "comprising" does not exclude other elements or steps and the "a" or "an" does not exclude a plurality. Also, elements described in association with different embodiments may be combined.

The present invention is applicable to any component carriers, in particular for high speed data transmission applications and for ultra-critical signals, more particularly in 5G, automotive or other RF applications.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
   a stack comprising a plurality of electrically conductive layer structures and a plurality of electrically insulating layer structures;
   a coax structure comprising an electrically conductive substantially horizontally extending central trace and an electrically conductive surrounding structure at least partially surrounding the electrically conductive substantially horizontally extending central trace with electrically insulating material in between;
   wherein the coax structure is formed by material of the layer structures of the stack;
   vertical portions of the electrically conductive surrounding structure are formed by vertical trenches in one of the plurality of electrically insulating layer structures of the stack, wherein the trenches are filled with an electrically conductive material; and
   horizontal portions of the electrically conductive surrounding structure are formed by plated electrically conductive layers above and below one of the plurality of electrically insulating layer structures;
   wherein the electrically conductive substantially horizontally extending central trace is not electrically connected to the vertical portions and the horizontal portions.

2. The component carrier according to claim 1, wherein the trace and the surrounding structure are made of copper.

3. The component carrier according to claim 1, wherein the electrically insulating material comprises resin having reinforcing particles.

4. The component carrier according to claim 1, wherein the surrounding structure is formed of two substantially horizontally extending electrically conductive layer structures and of two substantially vertically extending electrically conductive layer structures.

5. The component carrier according to claim 1, wherein at least one of first and second ends of the electrically conductive substantially horizontally extending central trace is connected with an electrically conductive vertical through connection which is a copper filled laser via.

6. The component carrier according to claim 1, wherein the surrounding structure has a rectangular cross-section.

7. The component carrier according to claim 1, wherein the horizontal portions and the vertical portions of the surrounding structure are directly connected to each other.

8. The component carrier according to claim 1, wherein the surrounding structure is a sleeve surrounding the electrically conductive substantially horizontally extending central trace at all four sides thereof.

9. The component carrier according to claim 1, wherein the surrounding structure surrounds the electrically conductive substantially horizontally extending central trace at one, two, three or four sides thereof.

10. The component carrier according to claim 1, further comprising at least one of the following features:
the component carrier comprises at least one component being surface mounted on and/or embedded in the component carrier, wherein the at least one component is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
wherein at least one of the electrically conductive layer structures of the component carrier comprises at least one of the group consisting of copper, aluminum, nickel, silver, gold, palladium, and tungsten;
wherein the electrically insulating layer structure comprises at least one of the group consisting of reinforced or non-reinforced resin, epoxy resin or bismaleimidetriazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide;
wherein the component carrier is shaped as a plate;
wherein the component carrier is configured as one of the group consisting of a printed circuit board, a substrate, and an interposer;
wherein the component carrier is configured as a laminate-type component carrier.

11. The component carrier according to claim 5, further comprising:
a shielding structure which is a closed or open ring filled with an electrically conductive material which surrounds the electrically conductive vertical through connection.

12. The component carrier according to claim 5, wherein the surrounding structure has openings, where the electrically conductive vertical through connection extends through the surrounding structure.

13. A method of manufacturing a component carrier, the method comprising:
forming a stack comprising a plurality of electrically conductive layer structures and a plurality of electrically insulating layer structures;
forming a coax structure comprising an electrically conductive substantially horizontally extending central trace and an electrically conductive surrounding structure at least partially surrounding the electrically conductive substantially horizontally extending central trace with electrically insulating material in between;
wherein the method comprises forming the coax structure by material of the layer structures of the stack;
manufacturing vertical portions of the surrounding structure by forming vertical trenches in one of the plurality of electrically insulating layer structures of the stack and subsequently filling the trenches with an electrically conductive material; and
manufacturing horizontal portions of the surrounding structure by plating electrically conductive layers above and below the one of the plurality of electrically insulating layer structures;
wherein the electrically conductive substantially horizontally extending central trace is not electrically connected to the vertical portions and the horizontal portions.

14. The method according to claim 13, further comprising:
manufacturing the electrically conductive substantially horizontally extending central trace on a block of an electrically insulating material formed on a first electrically conductive layer structure from the plurality electrically conductive layer structures.

15. The method according to claim 13, further comprising:
manufacturing the horizontal portions of the surrounding structure and the electrically conductive substantially horizontally extending central trace by electrically conductive layer structures located at different levels.

16. The method according to claim 13, wherein filling the trenches is accomplished by depositing an electrically conductive material by at least one of plating and sputtering.

17. The method according to claim 13, wherein filling the trenches is accomplished by pressing an electrically conductive paste in the trenches.

18. The method according to claim 14, further comprising:
manufacturing the horizontal portions of the surrounding structure by the first electrically conductive layer structure below the block and a further electrically conductive layer structure above the electrically conductive substantially horizontally extending central trace and spaced therefrom by a further electrically insulating layer structure.

19. The method according to claim 15, wherein filing the trenches is accomplished by depositing an electrically conductive material by at least one of plating and sputtering.

20. The method according to claim 15, wherein filling the trenches is accomplished by pressing an electrically conductive paste in the trenches.

* * * * *